United States Patent
Chow et al.

(10) Patent No.: US 8,525,353 B2
(45) Date of Patent: Sep. 3, 2013

(54) MICROSPRING STRUCTURES ADAPTED FOR TARGET DEVICE COOLING

(75) Inventors: Eugene M. Chow, Fremont, CA (US); Eric J. Shrader, Belmont, CA (US); John S. Paschkewitz, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 113 days.

(21) Appl. No.: 13/330,316

(22) Filed: Dec. 19, 2011

(65) Prior Publication Data

US 2013/0154127 A1    Jun. 20, 2013

(51) Int. Cl.
*H01L 23/48* (2006.01)
*H01L 23/52* (2006.01)
*H01L 29/40* (2006.01)

(52) U.S. Cl.
USPC .... 257/784; 257/772; 257/734; 257/E21.006; 257/E21.077; 257/E21.499; 257/E21.503; 257/E21.508; 257/E21.509; 257/E21.511

(58) Field of Classification Search
USPC ............ 257/784, 772, 779, 734, 796, 930, 257/E21.006, E21.077, E21.499, E21.503, 257/E21.509, E21.511
See application file for complete search history.

(56) References Cited

U.S. PATENT DOCUMENTS

| | | | |
|---|---|---|---|
| 5,613,861 A * | 3/1997 | Smith et al. ..................... 439/81 |
| 5,848,685 A | 12/1998 | Smith et al. | |
| 5,914,218 A * | 6/1999 | Smith et al. ................... 430/320 |
| 5,944,537 A | 8/1999 | Smith et al. | |
| 5,979,892 A | 11/1999 | Smith | |
| 6,184,065 B1 | 2/2001 | Smith et al. | |
| 6,184,699 B1 | 2/2001 | Smith et al. | |
| 6,213,789 B1 | 4/2001 | Chua et al. | |
| 6,264,477 B1 | 7/2001 | Smith et al. | |
| 6,290,510 B1 | 9/2001 | Fork et al. | |
| 6,299,462 B1 | 10/2001 | Biegelsen | |
| 6,352,464 B1 | 3/2002 | Kim et al. | |
| 6,361,331 B2 | 3/2002 | Fork et al. | |
| 6,392,524 B1 | 5/2002 | Biegelsen et al. | |
| 6,396,677 B1 | 5/2002 | Chua et al. | |
| 6,411,427 B1 | 6/2002 | Peeters et al. | |
| 6,439,898 B2 | 8/2002 | Chua et al. | |
| 6,504,643 B1 | 1/2003 | Peeters et al. | |
| 6,528,350 B2 | 3/2003 | Fork | |
| 6,534,249 B2 | 3/2003 | Fork et al. | |
| 6,560,861 B2 | 5/2003 | Fork et al. | |
| 6,582,989 B2 | 6/2003 | Biegelsen et al. | |
| 6,595,787 B2 | 7/2003 | Fork et al. | |
| 6,606,235 B2 | 8/2003 | Chua et al. | |
| 6,621,141 B1 | 9/2003 | Van Schuylenbergh et al. | |
| 6,632,373 B1 | 10/2003 | Rosa et al. | |
| 6,646,533 B2 | 11/2003 | Biegelsen et al. | |
| 6,655,964 B2 | 12/2003 | Fork et al. | |
| 6,658,728 B2 | 12/2003 | Fork et al. | |
| 6,668,628 B2 | 12/2003 | Hantschel et al. | |

(Continued)

*Primary Examiner* — David Nhu
(74) *Attorney, Agent, or Firm* — Jonathan A. Small

(57) ABSTRACT

In a system for providing temporary or permanent connection of an integrated circuit die to a base substrate using electrical microsprings, a thermal element is provided that assists with cooling of the pad structure during use. The thermal element may be formed of the same material and my similar processes as the microsprings. The thermal element may be one or more block structures or one or more thermal microsprings. The thermal element may be provided with channels to contain and/or direct the flow of a thermal transfer fluid. Cooling of components associated with the pad structure (e.g., ICs) may be provided.

20 Claims, 8 Drawing Sheets

(56) References Cited

U.S. PATENT DOCUMENTS

| | | |
|---|---|---|
| 6,672,875 B1 | 1/2004 | Mathieu et al. |
| 6,684,499 B2 | 2/2004 | Romano et al. |
| 6,734,425 B2 | 5/2004 | Hantschel et al. |
| 6,743,982 B2 | 6/2004 | Biegelsen et al. |
| 6,788,086 B2 | 9/2004 | Hantschel et al. |
| 6,794,725 B2 | 9/2004 | Lemmi et al. |
| 6,794,737 B2 | 9/2004 | Romano et al. |
| 7,166,326 B1 | 1/2007 | DiStefano |
| 7,230,440 B2 | 6/2007 | Hantschel et al. |
| 7,550,855 B2 | 6/2009 | Hantschel et al. |
| 7,927,905 B2 | 4/2011 | Chow et al. |
| 2002/0122766 A1 | 9/2002 | Lieber et al. |
| 2004/0022040 A1 | 2/2004 | Sitaraman et al. |
| 2004/0102064 A1 | 5/2004 | Mathieu |
| 2005/0017171 A1 | 1/2005 | Samuelson et al. |
| 2005/0121758 A1 | 6/2005 | DiStefano et al. |
| 2006/0076693 A1 | 4/2006 | Hantschel et al. |
| 2008/0095996 A1 | 4/2008 | Chua et al. |

* cited by examiner

MICROSPRING STRUCTURES ADAPTED FOR TARGET DEVICE COOLING

BACKGROUND

The present invention relates generally to photolithographically patterned spring contacts, and more particularly to structures incorporating electrical microsprings with thermal structures to provide both microspring-based electrical contacts as well as target device cooling.

The maximum complexity of an integrated circuit is limited by yield issues. In some applications, highly complex functions can be implemented at lower cost by using multiple integrated circuits mounted to a base substrate using bonding of multi-chip modules or flip-chip packages. Ball grid array (BGA) or flip chip (FC) bonding utilizes a two-dimensional grid of solder balls for die attachment which are heated to form a metallurgical junction. Details of BGA and FC bonding are well known.

In general, solder balls need to be large in order to have the necessary mechanical compliance against shear stresses induced by differences in the coefficient of thermal expansion (CTE) between the die and the base substrate, which results in a long thermal path and limited thermal conductivity. In addition, solder-bonding restricts the choice of base substrate to avoid the mechanical stress induced by a difference in CTE between the die and base substrates. The solder reflow process requires high temperature usually (>200 C). In certain applications, an integrated circuit is attached using solder with a polymer underfill between the integrated circuit and the base substrate in order to minimize the mechanical stress on the solder balls. The required underfill material has poor thermal conductivity, and as a result the heat transfer from the integrated circuit to the base substrate may be poor. A mechanical heat sink may be mounted to the back of the integrated circuit die, but in many applications such as cell phones, laptop and tablet computers, and other compact devices there is insufficient height to permit an adequately tall heat sink to be used. Further still, heat sinks add cost, weight, and manufacturing complexity.

Microsprings are an alternative to solder bonding for electrical interconnect between components such as between a semiconductor die and base substrate. Microsprings have been used for electrical contact to a semiconductor die, for example in probe cards for semiconductor die testing. However, in order to use microsprings as electrical contacts for semiconductor die in-field applications, certain semiconductor test arrangements, and so on, it is necessary to provide a thermal path that is at least as good as that provided by solder bonding, and preferably improve the thermal path compared to solder bonding. A solution to the thermal problems associated with the use of microsprings in applications such as multichip modules has not been disclosed.

SUMMARY

Accordingly, the present disclosure is directed to systems and methods for addressing the aforementioned shortcomings. One aspect of the present disclosure is directed to contacting a semiconductor die with microspring contacts. Another aspect is directed to contacting one or more semiconductor die by way of a base substrate such as a ceramic substrate or a printed circuit board with microspring contacts. In both of these aspects good electrical contact using microsprings and good thermal contact to the semiconductor die are provided. Also, a defective semiconductor die may be removed and replaced, particularly without disturbing other semiconductor die which may be mounted to the same base substrate.

Therefore in one embodiment, a thermal and electrical contact structure for contacting a pad structure is disclosed, comprising: a substrate; an electrical contact pad formed on said substrate; an electrical microspring structure formed over said substrate and comprising an anchor portion and a free portion, the anchor portion being fixed to said substrate and in electrical communication with said electrical contact pad, the free portion having a non-planar profile resulting from a stress differential established during fabrication of the electrical microspring, the free portion being free to move relative to said substrate; and a thermal element formed of thermally conductive material, formed over said substrate, and configured such that when said thermal and electrical structure is positioned proximate said pad structure with said electrical microspring making electrical contact with an electrical contact pad of said pad structure said thermal element is in physical contact with said pad structure to permit thermal conduction between said pad structure and said thermal and electrical contact structure.

According to an additional aspect of the present disclosure, the thermal element may be formed on or bonded to either a spring substrate or a pad (e.g., IC substrate), such that when the spring and pad substrates are mounted together, the thermal block is in thermal contact with both the spring and pad substrate.

According to another aspect of the present disclosure, additional microsprings may be added to regions of the spring substrate that are not used for electrical contact, and these additional microsprings can provide an additional thermal path for cooling.

According to still another aspect of the present disclosure, the gap between the spring and pad substrate may be filled with a material that is more thermally conductive than air.

According to yet another aspect of the present disclosure, the spring and pad substrates may be filled with a moving gas or liquid, to carry heat away from hot spots on either substrate or semiconductor die, where the heat can be absorbed in a cooler region of the disclosed device.

According to a still further aspect of the present disclosure, microchannels may be added between the spring and pad substrate, which are filled with a moving liquid or gas to carry heat away from the spring substrate, pad substrate, and or electrical components connected thereto.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

The features and advantages of the present disclosure are described and will be apparent to those skilled in the art from the following detailed description taken together with the accompanying figures, in which like reference numerals in the various figures denote like elements. The figures are not to scale.

DETAILED DESCRIPTION

Various embodiments of the present disclosure will now be described in detail with reference to examples thereof. However, such examples are merely illustrative, and should not be read as limiting the scope of the present disclosure, or the embodiments thereof, within the boundaries of the claims appended hereto.

We initially point out that description of well known starting materials, processing techniques, components, equipment and other well-known details may merely be summarized or are omitted so as not to unnecessarily obscure the details of the present disclosure. Thus, where details are otherwise well known, we leave it to the application of the present disclosure to suggest or dictate choices relating to those details.

Figure 1A:
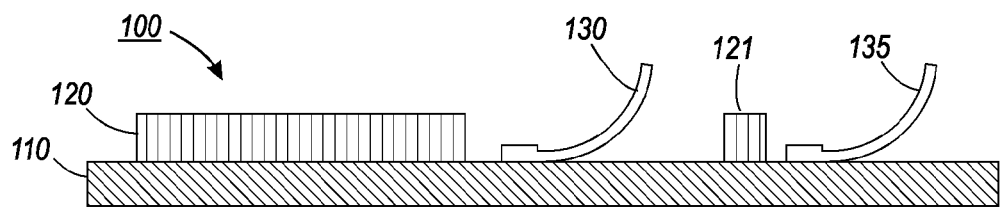
FIGS. 1A and 1B are cut-away side-view illustrations of a microspring layout with thermal element separate from and applied to a pad substrate, respectively, for improved thermal transfer according to an embodiment of the present disclosure.

With reference first to FIG. 1A, there is shown therein a first embodiment of a substrate 110 comprising one or more microsprings 130, 135, and thermal elements 120, 121. Substrate 110 and springs 130, 135 may be of a type known in the art, such as disclosed in U.S. Pat. No. 5,914,218, which is incorporated by reference herein.

Photolithographically patterned spring devices (referred to herein as "microsprings") have been developed, for example, to produce low cost probe cards, and to provide electrical connections between integrated circuits. A microspring is generally a micrometer-scale elongated metal structure having a free (cantilevered) portion which bends upward from an anchor portion which is affixed directly or indirectly to a substrate. The microspring is formed from a stress-engineered metal film (i.e., a metal film fabricated to have a stress differential such that its lower portions have a higher internal compressive stress than its upper portions) that is at least partially formed on a release material layer. The free portion of the microspring bends away from the substrate when the release material located under the free portion is removed (e.g., by etching).

The stress differential is produced in the spring material by one of several techniques. According to one technique, different materials are deposited in layers, each having a desired stress characteristic, for example a tensile layer formed over a compressive layer. According to another technique a single layer is provide with an intrinsic stress differential by altering the fabrication parameters as the layer is deposited. The spring material is typically a metal or metal alloy (e.g., Mo, MoCr, W, Ni, NiZr, Cu), and is typically chosen for its ability to retain large amounts of internal stress. Microsprings are typically produced using known photolithography techniques to permit integration of the microsprings with other devices and interconnections formed on a common substrate. Indeed, such devices may be constructed on a substrate upon which electronic circuitry and/or elements have previously been formed.

Such microsprings may be used in probe cards, for electrically bonding integrated circuits, circuit boards, and electrode arrays, and for producing other devices such as inductors, variable capacitors, scanning probes, and actuated mirrors. For example, when utilized in a probe card application, the tip of the free portion of a microspring is brought into contact with a contact pad formed on an integrated circuit, and signals are passed between the integrated circuit and test equipment via the probe card (i.e., using the microspring as an electrical contact).

In general, microsprings are unique in that they do not require underfill around contacts, due primarily to the fact that the springs are very compliant. This also means smaller gaps between the die and substrate can be achieved as compared to solder and other mounting methods.

According to the present disclosure, the space around the springs can be populated by thermal structures to aid in cooling of a die or other components. Additional microsprings, thermally conductive blocks (such as plated copper), and other structures can be used to create thermal dissipation paths, and reduce the effective thermal resistance to the pad substrate.

In the embodiment of FIG. 1A, thermal elements 120, 121 are solid or layered structures of a height generally slightly less than the height of released microsprings 130, 135. In one embodiment, thermal elements 120, 121 may be formed of copper, which has a thermal conductivity of approximately 401 W/mK. This is a significant improvement over current underfill materials, having a thermal conductivity of approximately 1 W/mK or less. Of course, thermal elements 120, 121 may be formed of other materials as may be appropriate to the particular application. In one embodiment, thermal elements 120, 121 are formed in processes compatible with the formation of microsprings 130, 135. In one embodiment, thermal elements 120, 121 are formed of a material having a relatively high electrical resistivity as compared to microsprings 120, 135. In still another embodiment, thermal elements 120, 121 are coated with a material having a relatively high electrical resistivity as compared to microsprings 120, 135.

Figure 1B:
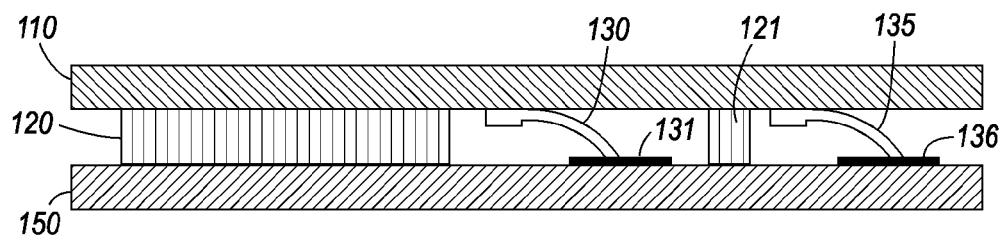

With reference to FIG. 1B, substrate 110 is shown inverted as compared to FIG. 1A, and tips of the microsprings 130, 135 are brought into physical and electrical contact with contact pads 131, 136, respectively, of pad substrate 150. The term pad substrate as used herein means an individual semiconductor die, other electronic component, a package, or a circuit board or the like to which one or more die or component are attached. Furthermore, contact to the pad substrate as used herein means physical and/or electrical contact to the die or component directly, contact to leads which may themselves connect to a die or component, or a combination of such contacts. The connection between microsprings 130, 135 and contact pads 131, 136, respectively, may be temporary, such as by bringing substrate 110 and pad substrate 150 in physical contact without binding, by applying a reworkable adhesive or solder between thermal elements 120, 121 and pad substrate 150, by applying solder to the tips of microsprings 130, 135 and/or contact pads 131, 136, respectively. Alternatively, the connection between microsprings 130, 135 and contact pads 131, 136, respectively, may be relatively more permanent, such as by applying an appropriate adhesive between thermal elements 120, 121 and pad substrate 150. However, one advantage of the present embodiment is that it is inherently reworkable, because the electrical contacts and the thermal blocks need not be irreversibly bonded to the pad substrate.

The presence of thermal elements 120, 121 permit heat transfer from bonding pad 150 to either or both of the space between spring substrate 110 and pad substrate 150 and the spring substrate 110 itself. Improved thermal conductivity is therefore provided, despite the fact that a single spring contact itself has less thermal conductivity than a BGA solder ball. A smaller gap between pad substrate (e.g., die) 150 and spring substrate 110 are possible (as known from the microspring art), which is important for mobile electronics and chip stacking markets, with the added advantage of improved thermal conductivity and consequent improved device cooling. The process is relatively low cost, because it can readily be integrated with the spring fabrication process. Also, in those embodiments in which a gap-stop is need for the spring assembly, thermal elements 120, 121 may serve that purpose (height defines the gap). Furthermore, thermal elements 120, 121 may, in appropriate embodiments, be electrically grounded to provide a low noise environment as well as a good ground plane for high frequency and power supply issues.

Figure 2A:
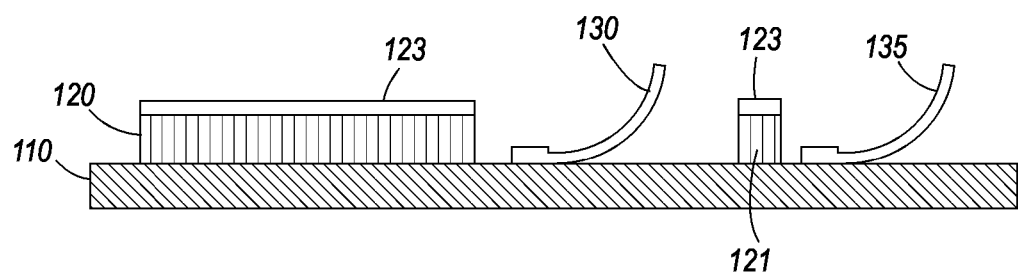
FIGS. 2A and 2B are cut-away side-view illustrations of a microspring layout with thermal element, with conformal layer, separate from and applied to a pad substrate, respectively, for improved thermal transfer according to an embodiment of the present disclosure.
Figure 2B:
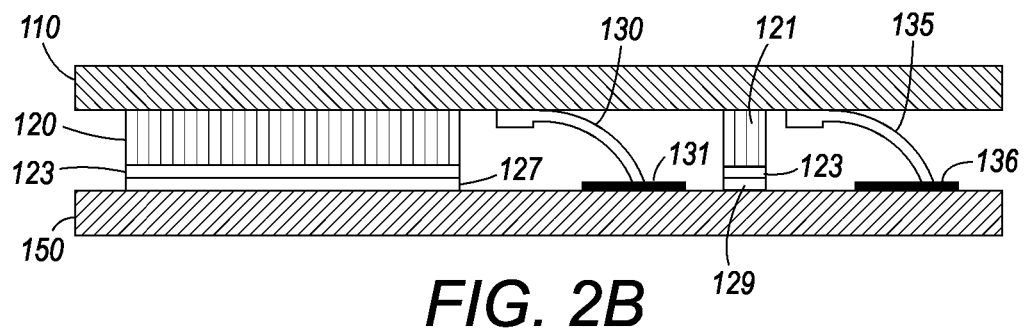

In a variation of the embodiment described above, a conformal interface 123 may be applied to the exposed surface of thermal elements 120, 121 to improve thermal contact with pad substrate 150. This embodiment is illustrated in FIGS. 2A (separate from pad substrate 150) and 2B (inverted and secured over pad substrate 150). There are a wide range of thermal interface materials (TIMs) and many ways to apply them. Greases, phase change materials, gels and adhesives may be used for cases where no patterning of the TIM is needed. Effective average thickness depends on the roughness of the substrate, but is typically several-to-many 10s of microns. To be integrated with springs (e.g., 130, 135), a patternable TIM is desired, so that the TIM does not interfere with the electrical signal spring contact locations. Wet-applied polymers or dry compliant films can be used, as they can be patterned with a variety of means, such as direct deposition (ink jet), screen printing, or photo-patterning. Thermal contacts 127, 129 may optionally be provided on pad substrate 150 to improve thermal conductivity and contact between thermal structures 120, 121, respectively.

Figure 3A:
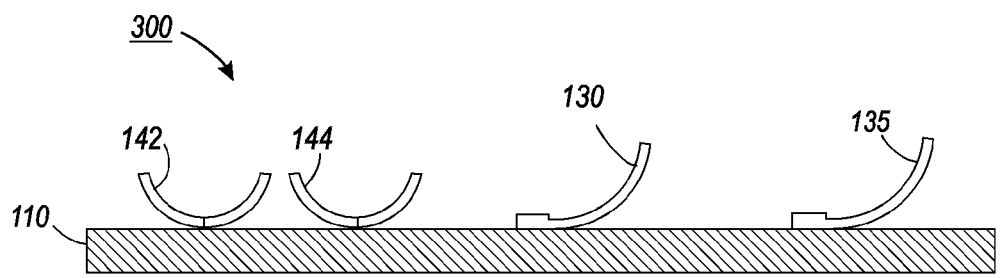
FIGS. 3A and 3b are cut-away side-view illustrations of a spring substrate including cooling microsprings to provide heat transfer, separate from and applied to a pad substrate, respectively, according to an embodiment of the present disclosure.

With reference to FIG. 3A, according to another embodiment 300 of the present disclosure, in addition to the electrical contact microsprings 130, 135, thermal (cooling) springs 142, 144 may be formed in place of the thermal elements 120, 121 (e.g., of FIG. 1A). Cooling microsprings 120, 121 are configured for connection to other than an active electrical element, and are therefore separate from (electrical) microsprings 130, 135. Cooling springs 142, 144 therefor serve as thermal contacts. Cooling springs 142, 144 may be formed from the same materials and during the same processes as employed to form electrical contact microsprings 130, 135. In one embodiment, electrical contact microsprings 130, 135 and cooling springs 142, 144 are of relatively the same scale (size). While shown as laterally displaced from electrical contact microsprings 130, 135 cooling springs 142, 144 may alternatively be interleaved in an array of electrical contact microsprings 130, 135 as may be appropriate for particular applications.

Figure 3B:
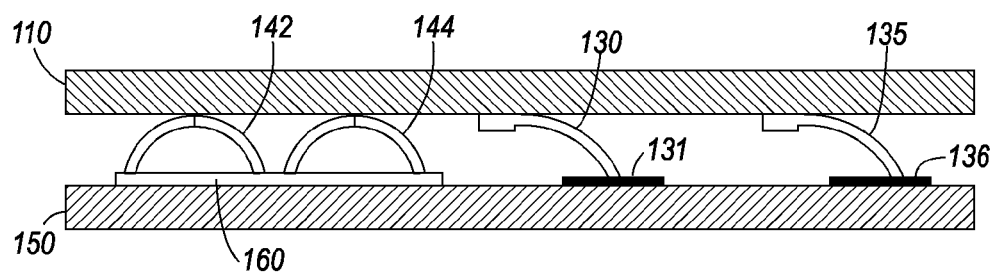

With reference to FIG. 3B, pad substrate 150 is formed to carry one or both contact pads 131, 136 and thermal contact pad 160. Spring substrate 110 is shown in FIG. 3B inverted and mated to pad substrate 150 (again temporarily or relatively more permanently) such that electrical contact microsprings 130, 135 are in physical and electrical contact with contact pads 131, 136, and cooling springs 142, 144 are in physical and thermal contact with thermal contact pad 160. This substrate mating process results in electrical conductivity between spring substrate 110 and pad substrate 150 as a result of current flow through interconnect springs 130 and 135 which press against electrical pads 131 and 136 on pad substrate 150, and thermal conductivity as a result of heat transfer through cooling springs 142, 144.

Cooling springs 142, 144 provide thermal transfer only at small contact points on spring substrate 110 and pad substrate 150, which results in lateral thermal gradients (left to right, and in and out of the page relative to FIG. 3B) across both spring substrate 110 and pad substrate 150. Embodiments are described in more detail herein (e.g., with reference to FIG. 1A) that provide larger contact area and thermal transfer efficiency. However, in certain applications, cooling springs 142, 144 are appropriate and sufficient for improved cooling. For example, they may present a relatively large surface area for thermal transfer. The efficiency of cooling springs 142, 144 may be increased by use in the present embodiment (and each of the embodiments described herein), of one or more thermal pads 160 that can be formed on pad substrate 150 to reduce thermal gradients, at least across pad substrate 150. Thermal pads are regions formed or patterned with relatively high thermal conductivity, ideally thermally connected to regions of lower temperature. Thermally conductive metal such as copper or other metals which spread out heat may serve as thermal pads.

Figure 4A:
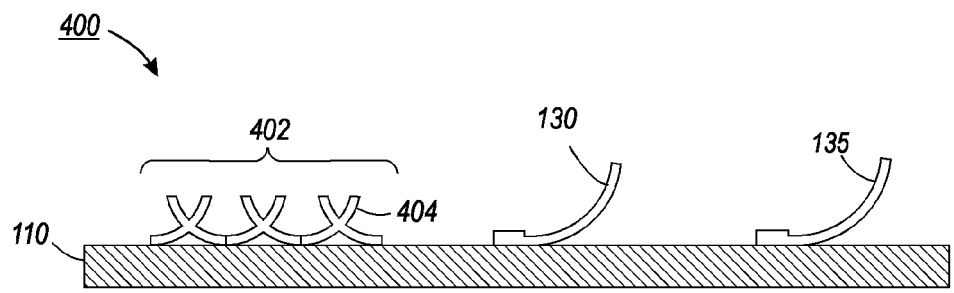
FIGS. 4A and 4B, are cut-away side-view illustrations of a spring substrate including microsprings pre-plating and post-plating, respectively, to form tip bridges.

With reference next to FIG. 4A, another embodiment 400 of a spring substrate 110 with electrical contact microsprings 130, 135 is shown. Embodiment 400 further includes an array 402 of cooling springs 404 (again formed to laterally spaced apart from microsprings 130, 135, but may also be interspersed therewith. Cooling springs 404 may be relatively smaller than microsprings 130, 135, or alternatively of comparable size. Cooling springs 404 may be formed through the aforementioned stress-differential process.

Figure 4B:
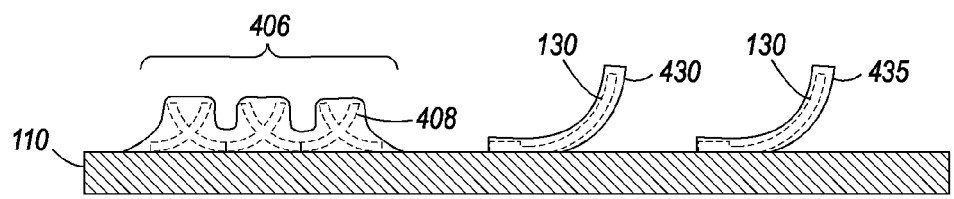
Figure 4C:
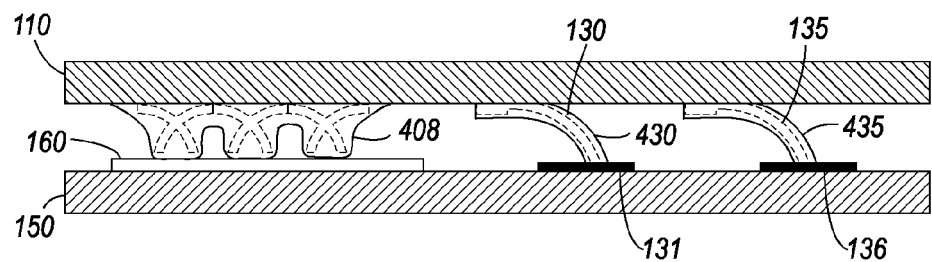
FIG. 4C is an illustration of a spring substrate including plated microsprings applied to a pad substrate in order to provide heat transfer according to an embodiment of the present disclosure.

Cooling springs are position such that their tips touch or overlap, and optionally physically contact, one another (e.g., adjacent springs 404 displaced slightly into or out of the page of FIG. 4A). As is known in the art, microsprings are often plated prior to connection to a pad substrate. This plating provides improved mechanical strength, improved conductivity, improved contact surface area, and so on. One consequence of this plating process in the present embodiment is that the cooling springs 404 are plated together (i.e., they become one conjoined, monolithic structure). In the plating process, the overlapping ends of springs 404 increase in thickness and merge together to form a solid tip bridge. This forms a relatively larger structure 406 comprised of multiple ridge structures 408 shown in FIG. 4B. When inverted and mated with pad substrate 150 as described above, and shown in FIG. 4C, each ridge structure 408 provides an increase thermal conductivity as compared, for example, to the individual cooling springs 142, 144 (e.g., FIG. 3A).

During the plating process, interconnect springs 130 and 135 also become thicker and stiffer, resulting in stiffened interconnect springs 430 and 435. Interconnect springs 130 and 135 should be designed to be thinner and/or longer if they are going to be plated, in order for stiffened interconnect springs 430 and 435 to have the necessary mechanical compliance due to the increased thickness after plating.

The embodiments described above have assumed that no special thermal transfer fluid (other than air) is disposed between the spring substrate and the pad substrate. And even for air as the cooling thermal transfer fluid, the embodiments described above do not make special accommodations for fluid flow in the region of the thermal elements or cooling springs. However, it is contemplated herein that both special thermal transfer fluids and specific accommodations for such fluids are possible.

Figure 5A:
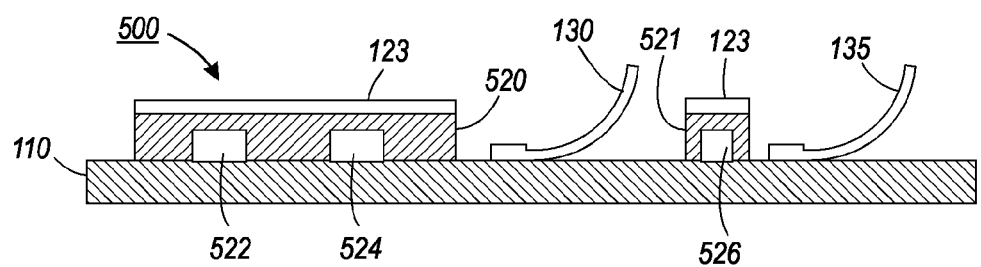
FIGS. 5A and 5B are cut-away side-view illustrations of a spring substrate including thermal transfer fluid receiving channels to provide heat transfer separate from and applied to a pad substrate, respectively, according to an embodiment of the present disclosure.
Figure 5B:
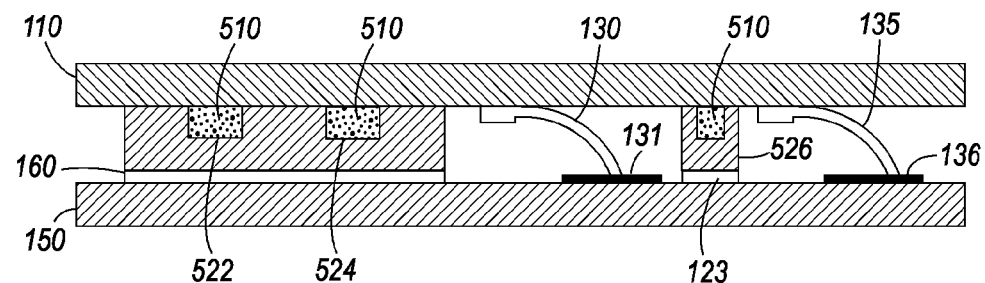

With reference next to FIG. 5A, another embodiment 500 of a substrate with electrical contact microsprings 130, 135 is shown, According to embodiment 500, a thermal element 520 is provided in a similar fashion to element 120 of FIG. 1A. However, element 520 has formed therein one or more thermal transfer fluid receiving channels 522, 524. Similarly, other thermal elements such as 521 may also be formed, with similar thermal transfer fluid receiving channels 526. Thermal transfer fluid receiving channels 522, 524, 526 are formed to receive, and in certain embodiments to facilitate a moving flow of a liquid or gas thermal filler material 510, which removes heat from spring substrate 110, and may transfer this heat to pad substrate 150 or external to the combination of spring substrate 110 and pad substrate 150. A suitable gas for thermal transfer fluid receiving channels 522, 524, 526 is Helium, although other appropriate gasses are contemplated herein. Water or other liquid may form a suitable liquid for thermal transfer fluid receiving channels 522, 524, 526.

Figure 6A:
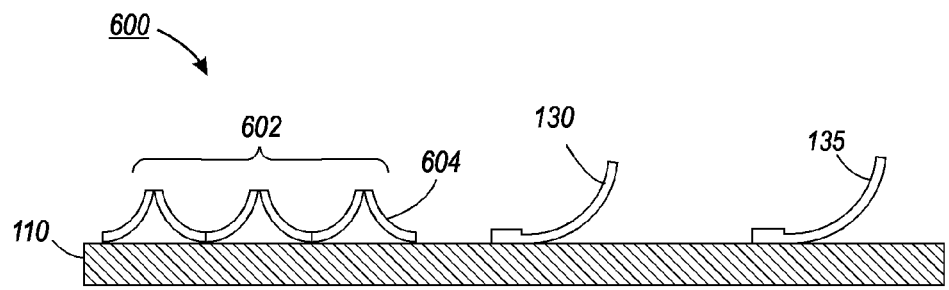
FIGS. 6A, 6B are cut-away side-view illustrations of a spring substrate including microsprings pre-plating and post-plating, respectively, to form thermal transfer fluid receiving channels separate.
Figure 6B:
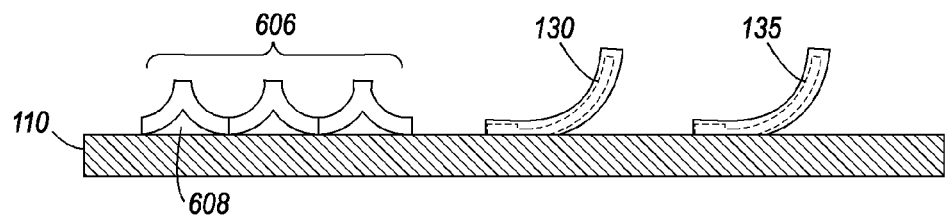
Figure 6C:
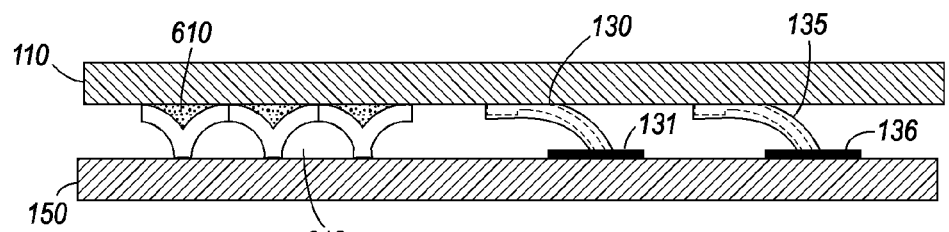
FIG. 6C is a cut-away side-view illustration of a spring substrate including plated thermal microsprings and thermal transfer fluid receiving channels applied to a pad substrate in order to provide heat transfer according to an embodiment of the present disclosure.

With reference to FIG. 6A, another embodiment 600 of a spring substrate 110 with electrical contact microsprings 130, 135 is shown, According to embodiment 600, an array 602 of cooling springs 604 is formed laterally spaced from (or interspersed with) electrical contact microsprings 130, 135. Cooling springs 604 may be formed through the aforementioned stress-differential process, similar to microsprings 130, 135. When plated, as shown in FIG. 6B, springs 604 are interconnected and form a thermal contact structure 606, defining thereunder channels 608 to receive, and in certain embodiments to facilitate a moving flow of a liquid or gas thermal filler material 610. The spring substrate 110 with electrical contact microsprings 130, 135, thermal contact structure 606, and thermal filler material 610 within channels 608 are shown in FIG. 6C inverted and mated to an appropriate pad substrate 150. It will be noted in this embodiment that thermal filler material 610 may either be separate from (i.e., exclusively within channels 608) or in contact with regions of pad substrate 150 (i.e., in secondary channels 612).

Figure 7:
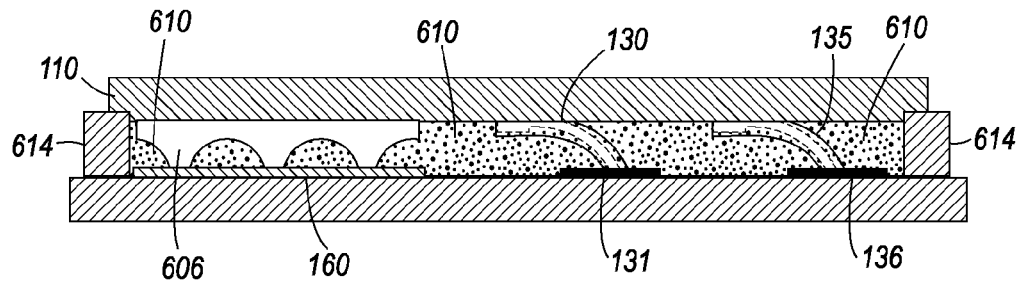
FIG. 7 is a cut-away side-view illustration of a spring substrate with plated microsprings and thermal transfer fluid receiving channels, with thermal transfer fluid disposed therein, applied to a pad substrate in order to provide heat transfer according to an embodiment of the present disclosure.

An example of a structure in which thermal filler material 610 completely fills the free space between spring substrate 110 and pad substrate 150 is illustrated in FIG. 7. Edge seals 614 assist with retaining the thermal filler material 610 within the free space between spring substrate 110 and pad substrate 150.

Figure 8A:
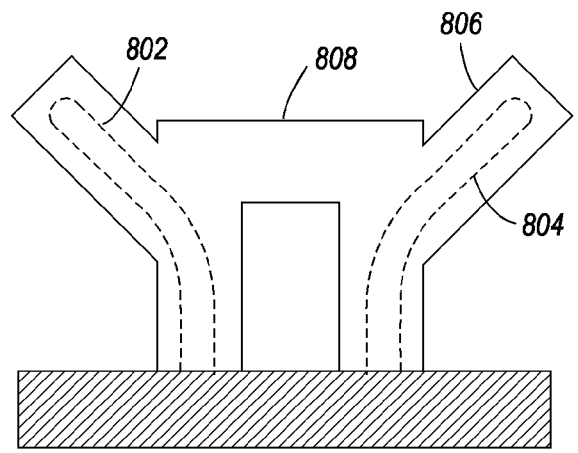
FIGS. 8A and 8B are illustrations of plated microspring layouts intended to increase the surface area of the released structure for improved thermal transfer according to two variations of an embodiment of the present disclosure.
Figure 8B:
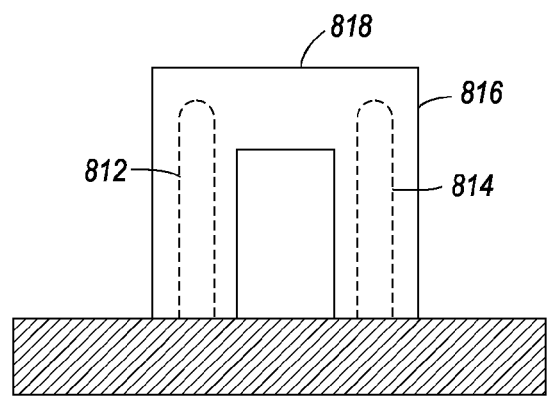

With reference to FIGS. 8A and 8B, stand-alone alternative spring and thermal element structures are illustrated. As previously mentioned, there is a desire to increase the surface area of the released structure in order to improve the thermal transfer of the resulting structure to the surrounding gas or liquid which takes heat away (like fins on a heat sink). Further, it has been mentioned that during the plating of released structures, individual released structures may be joined. In the embodiment of FIG. 8A released springs 802, 804 are encased in plating material 806, and a "bridge" 808 formed of plating material between plated springs 802, 804. In the embodiment of FIG. 8B released springs 812, 814 are similarly encased in plating material 816, and a "bridge" 818 formed of plating material between plated springs 812, 814. Many similar variations of bridged structures are contemplated and within the scope of the present disclosure.

As mentioned previously, the thermal filler material of various embodiments discussed above may either be relatively static and disposed in regions between spring substrate 110 and pad substrate 150, or may be caused to flow therein. Various embodiments for achieving thermal filler material flow are next described.

Figure 9:
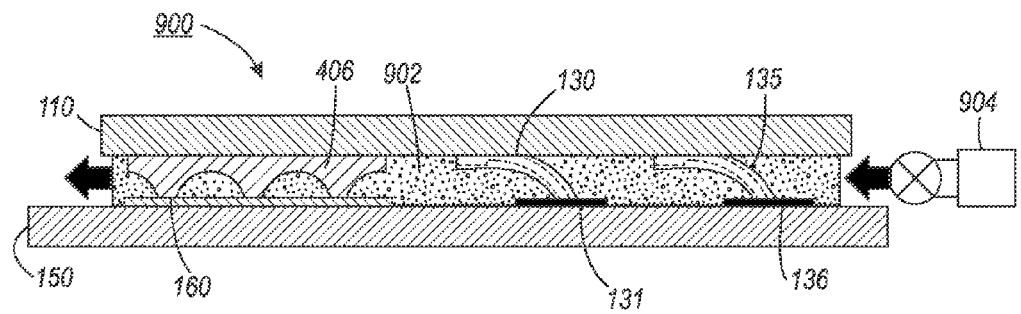
FIG. 9 is a cut-away side view of a spring substrate with plated microsprings and thermal transfer fluid receiving channels, with thermal transfer fluid disposed therein, and a pumping system for thermal transfer fluid flow through the channels, applied to a pad substrate in order to provide heat transfer according to an embodiment of the present disclosure.
Figure 10:
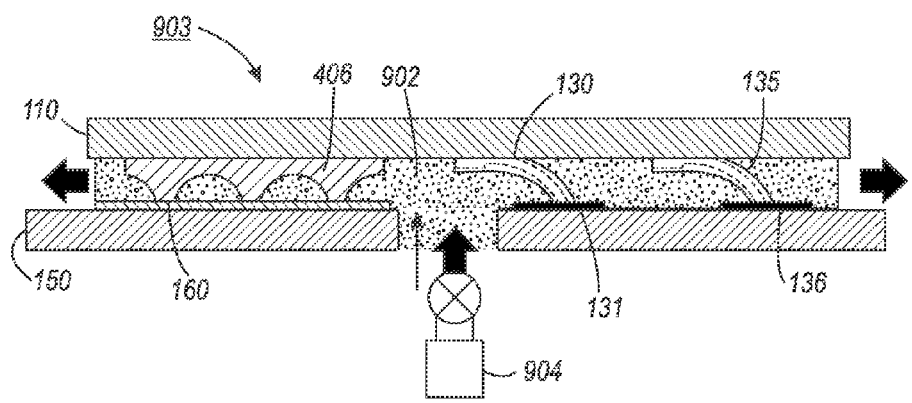
FIG. 10 is a cut-away side view of a spring substrate with plated microsprings and thermal transfer fluid receiving channels, with thermal transfer fluid disposed therein, and a pumping system for thermal transfer fluid flow through the channels, applied to a pad substrate in order to provide heat transfer according to another embodiment of the present disclosure.

With reference to FIG. 9, an embodiment 900 of the structure of FIG. 4 is shown in which a thermal filler material 902 is pumped, from pump 904, through the free space between spring substrate 110 and pad substrate 150. In the embodiment of FIG. 9, a lateral fluid flow is maintained to remove heat energy from pad substrate 150. In an alternative embodiment 903, thermal filler material 902 may be pumped from the backside of pad substrate 150, as illustrated in FIG. 10.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way.

Furthermore, various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A thermal and electrical contact structure for contacting a pad structure, comprising:
   a substrate;
   an electrical contact pad formed on said substrate;
   an electrical microspring structure formed over said substrate and comprising an anchor portion and a free portion, the anchor portion being fixed to said substrate and in electrical communication with said electrical contact pad, the free portion having a non-planar profile, the free portion being free to move relative to said substrate; and
   a thermal element formed of thermally conductive material, formed over said substrate, and configured such that when said thermal and electrical contact structure is positioned proximate said pad structure with said electrical microspring structure making electrical contact with an electrical contact pad of said pad structure said thermal element is in physical contact with said pad structure to permit thermal conduction between said pad structure and said thermal and electrical contact structure.

2. The thermal and electrical contact structure of claim 1, wherein said electrical microspring structure and said thermal element are specifically configured for temporary, removable engagement with said electrical contact pad and said pad structure, respectively.

3. The thermal and electrical contact structure of claim 1, wherein said electrical microspring structure and said thermal element are formed of the same material.

4. The thermal and electrical contact structure of claim 3, wherein said thermal element is an electrically conductive material and is provided with connection to an electrical ground, thereby providing a grounding plane for the thermal and electrical contact structure.

5. The thermal and electrical contact structure of claim 1, wherein said thermal element has formed thereover a thermally conductive physically conformal material layer to facilitate a physical connection between said thermal element and said pad structure.

6. The thermal and electrical contact structure of claim 1, wherein said thermal element has formed therein a thermal transfer fluid receiving channel.

7. The thermal and electrical contact structure of claim 6, wherein said thermal transfer fluid receiving channel is disposed such that thermal transfer fluid disposed therein may be in physical and thermal contact with said pad structure.

8. The thermal and electrical contact structure of claim 1, wherein said thermal element is a thermal microspring configured for connection to other than an active electrical element, said thermal microspring comprising an anchor portion and a free portion, the anchor portion being fixed to said substrate and in thermal communication therewith, the free portion having a non-planar profile, the free portion being free to move relative to said substrate.

9. The thermal and electrical contact structure of claim 1, wherein said thermal element comprises a plurality of thermal microsprings configured for connection to other than an active electrical element, each said thermal microspring comprising an anchor portion and a free portion, the anchor portion being fixed to said substrate and in thermal communication therewith, the free portion having a non-planar profile, the free portion being free to move relative to said substrate.

10. The thermal and electrical contact structure of claim 9, further comprising a plating coating applied over said plurality of thermal microsprings such that said coating forms a monolithic structure forming said thermal element.

11. The thermal and electrical contact structure of claim 10, wherein a plurality of free portions of said thermal microsprings are in physical contact with one another.

12. The thermal and electrical contact structure of claim 9, wherein said plurality of thermal microsprings define a plurality of thermal transfer fluid receiving channels.

13. The thermal and electrical contact structure of claim 12, wherein said thermal transfer fluid receiving channels are disposed such that thermal transfer fluid disposed therein may be in physical and thermal contact with said pad structure.

14. A thermal and electrical contact structure for contacting a pad structure, comprising:
   a substrate;
   an electrical contact pad formed on said substrate;
   a plurality of electrical microspring structures, each said electrical microspring structure formed over said substrate and comprising an anchor portion and a free portion, the anchor portion being fixed to said substrate and in electrical communication with said electrical contact pad, the free portion having a non-planar profile, the free portion being free to move relative to said substrate;
   a plurality of thermal microspring structures, each said thermal microspring structure formed over said substrate, of thermally conductive material, and comprising an anchor portion and a free portion, the anchor portion being fixed to said substrate and in thermal communication therewith, the free portion having a non-planar profile, the free portion being free to move relative to said substrate;
   said plurality of thermal microspring structures defining a plurality of thermal transfer fluid receiving channels; and
   said electrical and thermal microsprings configured such that when said thermal and electrical contact structure is positioned proximate said pad structure each said plurality of electrical microspring structures makes physical and electrical contact with an electrical contact pad of said pad structure and each said thermal microspring makes physical and thermal contact with said pad structure to permit thermal conduction between said pad structure and said thermal and electrical contact structure.

15. A contact and pad structure assembly, comprising:
   thermal and electrical contact structure, comprising:
      a substrate;
      an electrical contact pad formed on said substrate;
      an electrical microspring structure formed over said substrate and comprising an anchor portion and a free portion, the anchor portion being fixed to said substrate and in electrical communication with said electrical contact pad, the free portion having a non-planar profile, the free portion being free to move relative to said substrate; and
      a thermal element formed of thermally conductive material, formed over said substrate, and configured such that when said thermal and electrical contact structure is positioned proximate said pad structure with said electrical microspring structure making electrical contact with an electrical contact pad of said pad structure said thermal element is in physical contact with said pad structure to permit thermal conduction between said pad structure and said thermal and electrical contact structure;
   a pad structure, comprising:
      a substrate;
      a semiconductor die having an electrical contact pad;
      a thermal contact region;

said thermal and electrical contact structure and said pad structure disposed relative to one another such that said electrical microspring structure makes physical and electrical contact with said electrical contact pad and said thermal element makes physical and thermal contact with said thermal contact region of said pad structure to permit thermal conduction between said pad structure and said thermal and electrical contact structure.

16. The contact and pad structure assembly of claim 15, wherein said thermal element is formed of an electrically conductive material and is provided with connection to an electrical ground, thereby providing a grounding plane.

17. The contact and pad structure assembly of claim 15, wherein said thermal element is a thermal microspring configured for connection to other than an active electrical element, said thermal microspring comprising an anchor portion and a free portion, the anchor portion being fixed to said substrate and in thermal communication therewith, the free portion having a non-planar profile, the free portion being free to move relative to said substrate.

18. The contact and pad structure assembly of claim 15, wherein said thermal element has formed therein a thermal transfer fluid receiving channel.

19. The contact and pad structure assembly of claim 18, wherein said thermal transfer fluid receiving channel is configured for thermal transfer fluid flow therein, and further comprising:
 a thermal transfer fluid disposed in said thermal transfer fluid receiving channel; and
 a thermal transfer fluid pumping subsystem for maintaining a thermal transfer fluid flow in said thermal transfer fluid receiving channel to thereby remove heat from said thermal and electrical contact structure and said pad structure.

20. The contact and pad structure assembly of claim 19, wherein said thermal transfer fluid is further disposed in free space between said thermal and electrical contact structure and said pad structure, and said thermal transfer fluid pumping subsystem is further configured for maintaining a thermal transfer fluid flow in said free space to thereby remove heat from said thermal and electrical contact structure and said pad structure.

* * * * *